United States Patent [19]
Tomikawa et al.

[11] Patent Number: 5,527,735
[45] Date of Patent: Jun. 18, 1996

[54] OHMIC ELECTRODE OF N-TYPE SEMICONDUCTOR CUBIC BORON NITRIDE AND METHOD OF PRODUCING SAME

[75] Inventors: Tadashi Tomikawa; Yoshiki Nishibayashi; Shin-ichi Shikata, all of Hyogo, Japan

[73] Assignees: Sumitomo Electric Industries, Ltd., Osaka; Research Institute of Innovative Technology for the Earth, Kyoto, both of Japan

[21] Appl. No.: 428,445

[22] Filed: Apr. 25, 1995

Related U.S. Application Data

[62] Division of Ser. No. 326,335, Oct. 20, 1994.

[30] Foreign Application Priority Data

Oct. 21, 1993 [JP] Japan .................. 5-287358

[51] Int. Cl.$^6$ ............................................. H01L 21/44
[52] U.S. Cl. .................. 437/184; 437/192; 437/190; 148/DIG. 113
[58] Field of Search .................. 437/184, 192, 437/190; 148/DIG. 113

[56] References Cited

U.S. PATENT DOCUMENTS

| 4,998,158 | 3/1991 | Johnson et al. | 257/751 |
|---|---|---|---|
| 5,057,454 | 10/1991 | Yoshida et al. | 437/184 |
| 5,187,560 | 2/1993 | Yoshida et al. | 257/76 |
| 5,232,862 | 8/1993 | Heremans et al. | 437/40 |
| 5,240,877 | 8/1993 | Yoshida et al. | 437/184 |
| 5,285,109 | 2/1994 | Tomikawa et al. | 257/741 |
| 5,298,461 | 3/1994 | Tomikawa et al. | 437/184 |

FOREIGN PATENT DOCUMENTS

| 0458353 | 11/1991 | European Pat. Off. . |
| 2199197 | 4/1974 | France . |
| 3120878 | 5/1991 | Japan . |
| 3112177 | 5/1991 | Japan . |
| 429376 | 1/1992 | Japan . |
| 429377 | 1/1992 | Japan . |
| 429378 | 1/1992 | Japan . |
| 429375 | 1/1992 | Japan . |
| 411688 | 1/1992 | Japan . |

Primary Examiner—George Fourson
Assistant Examiner—C. Everhart
Attorney, Agent, or Firm—Cushman Darby & Cushman

[57] ABSTRACT

N-type c-BN is a heat-resistant material with a wide band gap. Ohmic electrodes are indispensable for making semiconductor devices utilizing n-type c-BN. The electrodes proposed so far are likely to deteriorate in an atmosphere of high temperature. The degradation of electrodes hinders the production of semiconductor devices utilizing c-BN. A heat-resistant ohmic electrode is produced by forming a low contact resistance layer of a boride or a nitride of Ti, Zr or Hf on a heated c-BN and by covering the low resistance layer by an Au layer. Otherwise an ohmic electrode is produced by forming a low contact resistance layer of one of Ti, Zr, Hf, etc. on c-BN, making a diffusion barrier layer of W, Mo, Ta or Pt and depositing an Au layer on the diffusion barrier layer.

9 Claims, 1 Drawing Sheet

STRUCTURE A

STRUCTURE B

OHMIC ELECTRODE OF N-TYPE SEMICONDUCTOR CUBIC BORON NITRIDE AND METHOD OF PRODUCING SAME

This is a division of application Ser. No. 08/326,335, filed Oct. 20, 1994.

FIELD OF THE INVENTION

This application claims the priority of Japanese Patent Application No. 287358 filed Oct. 21, 1993, which is incorporated herein by reference.

This invention relates to an ohmic electrode of n-type semiconductor cubic boron nitride (c-BN) and a method for producing an ohmic electrode on a c-BN crystal. In particular, this invention proposes an ohmic electrode and a method of fabricating the ohmic electrode of c-BN which is suitable for making semiconductor devices favored with high resistance against heat.

BACKGROUND OF THE INVENTION

N-type semiconductor cubic boron nitride (c-BN) has high resistance against heat (stable up to about 1300° C.), a wide band gap (7 eV) and excellent stability against chemical reactions. N-type c-BN has been attracting strong attention as a promising material of heat resistant semiconductor devices, or optoelectronic devices for emitting the light ranging from ultraviolet to visible light. However, cubic boron nitride is not yielded as a natural resource. Ultra high pressure method synthesizes bulk crystals of c-BN.

Furthermore, vapor phase synthesis method fabricates thin films of c-BN on some substrate. Non-doped c-BN is an insulator with high resistivity. P-type c-BN is obtained by doping with beryllium (Be). Doping with silicon (Si) or sulfur (S) brings about n-type c-BN. Application to semiconductor devices necessitates a pn-Junction. A pn-junction can be fabricated on a c-BN by synthesizing an n-type c-BN crystal on a p-type c-BN crystal as a seed by the ultra high pressure synthesizing method, although it is difficult. Since a pn-Junction can be produced on a c-BN, some applications have been suggested regarding the semiconductor devices of c-BN.

① Japanese Patent Laying Open No. 4-11688 proposed an application of c-BN to semiconductor devices.

② Japanese Patent Laying Open No. 3-112177 made an offer of an application of unifying c-BN with diamond.

③ Japanese Patent Laying Open No. 1-259257 also suggested a complex of c-BN and diamond as a semiconductor device.

④ Japanese Patent Laying Open No. 4-29375 proposed an ohmic electrode of c-BN by the same inventors of the present invention.

An ohmic electrode is one of the most important parts in order to produce semiconductor devices. However there was no ohmic electrode of c-BN due to the too short history of c-BN as a semiconductor. Nobody except the Inventors has suggested a method of fabricating ohmic electrodes of c-BN. Only the Inventors of the present invention have suggested an ohmic electrode on a c-BN crystal in the above application. An ohmic electrode was produced with titanium (Ti), zirconium (Zr), hafnium (Hf) or an alloy including Ti, Zr and Hf.

⑤ Japanese Patent Laying Open No. 4-29376 suggested a method of producing an ohmic electrode with a metal including silicon (Si) or sulfur (S), or an alloy containing silicon (Si) or sulfur (S) by the same inventors.

⑥ Japanese Patent Laying Open No. 4-29377 made an offer of forming ohmic electrode of c-BN with boron (B), aluminum (Al), gallium (Ga), indium (In) or an alloy of B, Al, Ga or In.

⑦ Japanese Patent Laying Open No. 4-29378 mentioned a method of producing an ohmic electrode with vanadium (V), niobium (Nb) or tantalum (Ta) or an alloy including V, Nb or Ta.

An ohmic electrode is an electrode formed on a substrate or a film which is in ohmic contact with the substrate or the film crystal. "ohmic" means bilateral current-voltage property unlike diodes or rectifiers. The forward resistance is equal to the rear resistance at an ohmic electrode. Further, an ohmic electrode demands both small forward resistance and small rear resistance in order to minimize the loss of signal power at the electrode.

Besides the inherent resistance at the electrode, it is also desirable to reduce the resistance of the circuits following the electrode in order to produce good devices. Therefore, the ohmic electrode shall preferably adopt a multilayer structure in which more conductive Au or Al layer covers an ohmic contact metal in order to connect the contact metal with circuit patterns with little resistance. The higher layer metal (Au or Al) may be called an extraction electrode, since the layer connects the higher resistive electrode with outer circuit patterns or outer wires.

Prior art from ④ to ⑦ suggested ohmic electrodes of titanium (Ti), zirconium (Zr), hafnium (Hf), a metal containing Si or S, boron (B), aluminum (Al), gallium (Ga), indium (In), vanadium (V), niobium (Nb), tantalum (Ta) or so on. These materials can all form an ohmic contact with cubic boron nitride (c-BN). The contact has the bilateral character. The forward resistance and the rear resistance are nearly equal. Thus the electrodes can be called "ohmic".

However, these prior art did not satisfy the other requirement of ohmic electrodes. The metals or half-metals recommended as ohmic contact materials have resistivities more than ten times as high as that of gold (Au). Simple use of these high resistive metals or semi-metals would raise the resistance of the electrodes. Thus the prior structure adopted the extraction electrode (Au or Al) to reduce the resistance between the circuit patterns and the ohmic electrodes. The deposition of Au on the resistive material is also useful for wire-bonding between the electrodes and the pattern circuit pads. Prevention of oxidization of the ohmic electrodes necessitates the coating with Au.

High heat resistance is also required for the ohmic electrodes in order to apply c-BN to heat-resistant semiconductor devices or optoelectronic devices for emitting the light ranging from ultraviolet rays to visible rays. However it has been noticed that the electrodes suggested by ④ to ⑦ lack the heat resistance. Titanium (Ti), zirconium (Zr) and hafnium (Hf) are metals with a high melting point among the ohmic electrodes proposed by ④ to ⑦. Thus someone may suppose that the ohmic electrodes fabricated with the high melting point metals should enjoy high resistance against heat.

However the fact was otherwise to their surprise. The electrode of (c-BN)/(ohmic electrode of Ti, Zr or Hf)/(Au) in strata has a drawback that Ti, Zr or Hf atoms easily diffuse into the Au surface layer by heating at about 300° C. which is far lower than the melting points of the materials. Diffusing through the Au layer, the refractory metal atoms attain the surface of the Au layer and cover the Au layer surface. The segregation of the refractory metal on the Au layer raises the contact resistance of the ohmic electrode. A moderate temperature such as about 300° C. impairs the property of the ohmic electrode by the precipitation of the metal on the extraction layer of Au. These devices are useless even at about 300° C. because of to the increment of resistance by the diffusion of the metal in the Au layer.

Furthermore, even when the devices are operated by a large driving current at room temperature, the ohmic electrode Is heated at a temperature as high as 300° C by the generation of Joule's heat. The heat facilitates the diffusion of the high melting point metals in Au. Thus the drive of the devices even at room temperature degrades the performance of the device by increasing the extraction resistance by the deposition of metals on the top surface of the Au layer.

A purpose of the present invention is to provide an ohmic electrode of c-BN which prevents the refractory metal Ti, Zr or Hf composing the electrode from diffusing in the Au layer till the top surface. Another purpose of this invention is to provide an ohmic electrode immune from the segregation of the high melting point metal on the Au layer. Another object of the invention is to provide a c-BN semiconductor device with high heat resistance by an ohmic electrode endowed with low resistance at high temperature. Still further object of this invention is to provide an optoelectronic device which can emit highly luminous rays from ultraviolet wavelength to visible light wavelength by a big current injection.

SUMMARY OF THE INVENTION

This invention proposes an ohmic electrode of an n-type cubic boron nitride comprising a first layer of a boride or a nitride of anyone selected from metals of Ti, Zr and Hf or of a boride or a nitride of an alloy including anyone selected from metals of Ti, Zr and Hf and a second layer of Au. This electrode is called type A. This invention further proposes anther ohmic electrode of an n-type cubic boron nitride comprising a first layer of low contact resistance, a second layer of diffusion-barrier layer and a third layer of Au. This electrode is called type B. Both types A and B are similar in the purpose and the function.

First, type A is now explained. Type A of this invention has two layers. The first layer is borides or nitrides of Ti, Zr or Hf. The second layer is an Au layer.

[TYPE A]

First Layer: borides of Ti, Zr or Hf: TiB, $TiB_2$, $ZrB_2$, ZrB, $HfB_2$, etc. nitrides of Ti, Zr or Hf: TiN, ZrN, HfN, etc. borides of alloys including at least a metal chosen from among Ti, Zr and Hf Second Layer: Au One way of producing the electrode is to make the two layers in succession. The first layer Is produced by depositing a film of a boride or a nitride of Ti, Zr or Hf, or a boride or a nitride of an alloy including Ti, Zr or Hf on an n-type cubic boron nitride crystal, and by alloying the film with the c-BN crystal in order to come into an ohmic contact. The reason of adopting Ti, Zr or Hf is that these materials enable the electrode to make an ohmic contact with the n-type cubic boron nitride. The reason for employing borides or nitrides is that borides or nitrides effectively prevent the atoms of Ti, Zr or Hf from diffusing into the upper Au layer. It Is desirable to form the first layer at a substrate temperature higher than 300° C. in order to make an ohmic contact and reduce the contact resistance of the electrode. Otherwise it is preferable to anneal the crystal at a temperature higher than 300° C., when the electrode has been formed on the n-type c-BN crystal at a temperature lower than 300° C. The heating of the electrode enables the metal Ti, Zr or Hf to diffuse downward into the n-type c-BN and to produce an alloy of BN and a metal of Ti, Zr or Hf partially on the surface. If the first layer were made only of metal Ti, Zr or Hf instead of borides or nitrides, the metal atoms would freely diffuse also upward into the top Au layer and would make a low-conductive alloy with Au, when the crystal is annealed at a temperature higher than 300° C. The electrode would be useless because of the increment of the resistance at the top layer.

Another way to make the electrode is to produce the first electrode, process the first electrode and fabricate the second layer. In this case, a single element metal of Ti, Zr or Hf is deposited on an n-type cubic boron nitride crystal at a substrate temperature either higher than 300° C. or lower than 300° C. The high temperature coating of the monoelement metal forms a compound of the metal and the bottom BN crystal. Then the first layer naturally becomes a mixture of a boride and a nitride of the deposited metal. If the monoelement metal Is replenished on the n-type c-BN below 300° C., the BN crystal shall be heated above 300° C. in order to yield a boride and a nitride of the deposited metal. This way produces a nitride and a boride from a single element metal on the crystal. Then unreacted metal may remain in the surface of the first layer. The residual, unreacted metal Ti, Zr or Hf should be eliminated by solving selectively with an acid. If the metal remained in the first layer, the resistance of the electrode would increase by the formation of alloys of Au with Ti, Zr or Hf which diffused into the top Au layer by heating. Then the second layer becomes a mixture of a boride and a nitride. Finally Au is deposited on the first layer. The Au forms the second top layer.

Second, type B is explained. The second layer of borides or nitrides is separated into two layers In type B. Thus type B electrode has three layers.

[TYPE B]

First layer: low contact resistance layer: a single element or an alloy of Ti, Zr, Hf, B, Al, Ga, In, V, Nb or Ta or a metal Including Si or S.

Second layer: diffusion barrier layer: a single element metal or an alloy of W, Mo, Ta or Pt Third layer: Au layer The low contact resistance layer is made from a material which enables n-type BN to make an ohmic contact of a low resistance with it. In particular, a metal of Ti, Zr or Hf or an alloy including Ti, Zr or Hf is suitable for the low contact resistance first layer.

The diffusion barrier layer inhibits the material of the first layer from diffusing through the second layer. This name does not signify that the layer prevents the material of the second layer itself from diffusing out of the own layer. The second layer prohibits the low contact resistant material from diffusing upward into the top Au layer. The transference of the first layered material is forbidden by the diffusion barrier layer. The diffusion barrier layer is made from a single element metal of W, Mo, Ta or Pt or an alloy of W, Mo, Ta or Pt.

Since the diffusion barrier layer plays the role of inhibiting Ti, Zr, Hf, etc., too thin layer is useless. The barrier layer requires more than 100 nm of thickness. The more thick second layer can suppress the diffusion of Ti, Zr, Hf, etc. more rigorously. However, a too thick barrier layer pushes up the cost of material. Further, the resistance of the barrier layer increases in proportion to the thickness of the layer. The lower resistance is more favorable for an ohmic electrode. Less than 2 μ m is preferable for the thickness of the diffusion barrier layer. Thus the optimum thickness of the diffusion barrier layer is 100 nm to 2 μ m.

The low contact resistance is achieved either by forming the low contact resistant material metal layer on the n-type c-BN (n-c-BN in short) substrate at a temperature higher than 300° C. or by forming the low contact resistant material layer on the n-c-BN substrate at a temperature lower than 300° C. and by annealing the layer at a temperature higher than 300° C. The formation or annealing above 300° C. produces an alloy of the material with the n-c-BN, and makes an ohmic contact with low resistance.

The function of the electrodes is now clarified. The Inventors have discovered the fact that the barrier layer can prohibit the mutual diffusion between Au and a low contact resistant material by interposing the barrier layer between the Au layer and the low contact resistance layer for the first time. The structure B is based upon this discovery. The first layer shall be built by the materials of a single element of Ti, Zr, Hf, B, Al, Ca, In, V, Nb or Ta and an alloy of same or a metal including SI or S. A sufficiently low contact resistance ohmic electrode can be made, in particular, by a metal or an alloy of Ti, Zr or Hr.

The diffusion barrier layer is formed by a metal selected from the group of W, Mo, Ta and Pt. The barrier layer made from these materials can prevent the reciprocal diffusion of Au and the low contact resistant material. It is not fully clear yet why the material can suppress the mutual thermal diffusion between Au and one of Ti, Zr, Hf, etc. However, the following explanation may outline the function of a barrier. W, Mo, Ta and Pt are all refractory metals of high melting points. Atoms build up a strong lattice structure with high cohesion energy. It is difficult to replace a host atom with an alien atom in the high melting point metal, because the replacement requires a break of the strong bonds between the host atoms. Diffusion is a phenomenon of the pervasion of foreign atoms from low concentration regions to high concentration regions along the gradient of the concentration by thermal agitation. The bonds are successively exchanged between the host atoms and the impurity atoms in a metal bond. The exchange of the bonds is gradually progressing from the surface to the inner portion.

Replacement of the strong coupling in a high melting point metal demands an extremely high temperature. A temperature of 300° C. or a temperature slightly more than 300° C. for annealing or practical use is still insufficient to induce such a replacement of matrix atoms by alien atoms in the refractory metal. The strong atomic coupling enables W, Ta, Mo or Pt to forbid alien atoms invading in the metal. Thus W, Ta, Mo or Pt effectively inhibits the mutual diffusion between Au and one of Ti, Zr, Hf, etc. The heating for forming or annealing the low contract resistance layer does not induce the thermal diffusion of the low contact resistive material to the Au layer. The Au top layer is not degraded by alloying with Ti, Zr, Hf, etc. The ohmic electrodes still maintain the reciprocal, symmetric low resistance in spite of the high temperature invited by the production of Joule's heat by a big current flow. The above is the function of the structure B.

The function of the structure A is further clarified. The structure B features contrivance on the composition of materials for impeding the low contact resistance material from diffusing instead of the interposition of the diffusion barrier layer. The inventors have discovered that what diffuses into the Au layer is the unreacted remains of Ti, Zr or Hf, when ohmic electrodes are made on n-c-BN with one of Ti, Zr, Hf, etc. if no unreacted metal remained in the bottom layer of the electrode, no diffusion would occur. Thus the structure B adopts borides or nitrides in order to avoid the diffusion. In the structure B, a boride or a nitride of Ti, Zr, Hf, etc. composes the first layer with a low contact resistance instead of a single element metal of Zr, Ti, Hf, etc. The atoms of Zr, Ti, Hf, etc., In borides or nitrides are far more stable and immovable than a single element metal of Zr, Ti, Hf, etc., because borides or nitrides have strong bonds between B atoms or N atoms and other metal atom. If the atoms would diffuse, the atoms must transfer as a molecule of a boride or a nitride. The big size of the compounds makes it more difficult to move in the crystal structures. The Ti, Zr, Hf, etc., do not diffuse into the Au top layer during the annealing or the practical use. Thus Ti, Zr, Hf, etc. do not reveal on the top surface of the Au layer. On the contrary, there may be a probability of an increase of the contact resistance or a conversion to a non-ohmic contact by the boridation or nitridation of the low contact resistant materials, i.e. Ti, Zr, Hf, etc. This may be a big problem. However the inventors have confirmed that the ohmic contact and the low contact resistance are maintained in spite of the nitridation or boridation. The electrodes with the boride or nitride first layers exhibit sufficiently low and reciprocal resistances.

Two methods are available for making the layers of borides or nitrides as the first layers. Starting from a boride or nitride itself, one method makes boride layers or nitride layers by evaporating, sputtering or ion-plating the boride or nitride of a metal of Ti, Zr, Hf, etc. Starting from a metal of Ti, Zr, Hf, etc., the other method either forms metal layers on a n-type c-BN substrate at a sufficiently high temperature for inducing boridation or nitridation with the substrate elements, or forms metal layers at a lower temperature and anneals the metal layers into boride or nitride layers by letting the metal react with the substrate elements. In the latter case, if the metal of Ti, Zr, Hf, etc., remained, the active metal atoms would diffuse and appear on the top surface of the Au layer. Thus the probable residual metal should be removed. Then the metal atoms are eliminated by an acid treatment. The Au is further evaporated on the cleaned surface without metal atoms.

This invention succeeds in fabricating a highly heat resistant ohmic contact electrode with low resistance on n-type c-boron nitride crystals. This invention is, in particular, suitable for the production of heat-resistant semiconductor devices which are used in a high temperature atmosphere.

DETAILED DESCRIPTION OF PREFERRED EMBODIMENTS

[EMBODIMENTS AND COMPARISONS]

Figure 1:
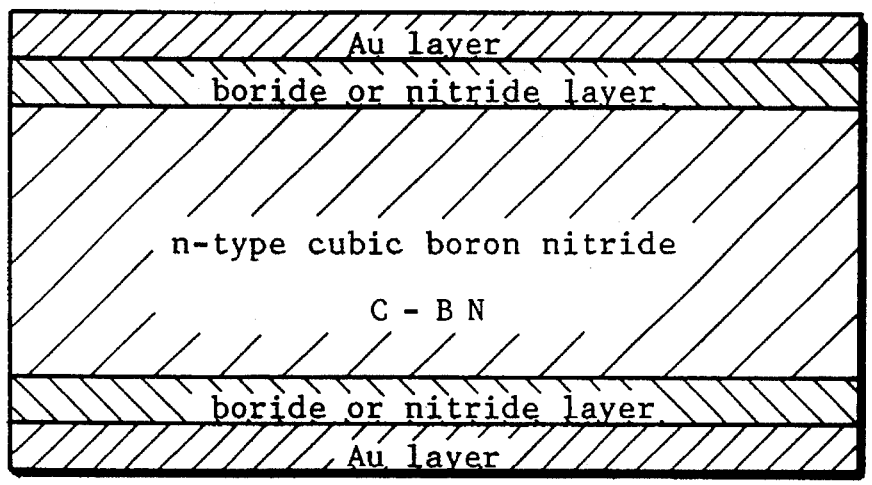
FIG. 1 is a sectional view of a c-BN substrate with a pair of electrodes of structure A on both surfaces to measure the resistance of the electrodes.

Various electrodes are fabricated with different materials, thicknesses, methods of production, substrate temperatures, anneal temperatures and acid treatment. These embodiments correspond to structure A and structure B. Besides the embodiments, comparison examples are also produced. In every sample, the top layer is an Au film which is made by vacuum evaporation. In order to inspect the influence of heating on the contact resistance, all the samples are annealed in 30 minutes at 500° C. at a pressure of $1 \times 10^{-5}$ Torr. The resistances of all the samples are measured before and after the annealing treatment. The resistances are measured by the four terminal method. Table 1 and Table 2 show the results of the measurements. Table 1 corresponds to structure A. Samples 1 to 15 are embodiments of structure A of the invention. Samples 16 to 20 are comparison examples.

Table 1. Structure A: Dependence of the change of resistance of electrodes upon materials, thicknesses, production methods, substrate temperatures, annealing temperatures, or acid treatment

TABLE 1

| | | | | Structure A | | | |
|---|---|---|---|---|---|---|---|
| No. | electrode | thickness (nm) | method | substrate temperature (°C.) | annealing temperature (°C.) | acid treatment before Au evaporation | change of registance |
| 1 | TiN | 20 | sputtering | 300 | Non | Non | 1.1 |
| 2 | TiB$_2$ | 15 | sputtering | 350 | Non | Non | 1.8 |
| 3 | ZrN | 20 | sputtering | 300 | Non | Non | 1.5 |
| 4 | ZrB$_2$ | 20 | sputtering | 400 | Non | Non | 1.2 |
| 5 | HfN | 15 | sputtering | 300 | Non | Non | 1.3 |
| 6 | HfB$_2$ | 20 | sputtering | 350 | Non | Non | 1.1 |
| 7 | TiN | 20 | sputtering | room temp. | 400 | Non | 1.2 |
| 8 | ZrB$_2$ | 15 | sputtering | room temp. | 300 | Non | 1.3 |
| 9 | HfN | 20 | sputtering | room temp. | 350 | Non | 1.8 |
| 10 | Ti | 30 | sputtering | 300 | non | Non | 1.5 |
| 11 | Zr | 25 | sputtering | room temp. | 350 | Fluoric acid | 1.4 |
| 12 | Hf | 30 | sputtering | 350 | Non | Fluoric acid | 1.2 |
| 13 | TiC | 25 | sputtering | 350 | Non | Fluoric acid | 1.6 |
| 14 | ZrB$_2$ | 20 | sputtering | room temp. | 300 | Fluoric acid | 1.8 |
| 15 | HfSi | 25 | sputtering | room temp. | 400 | Fluoric nitric acid | 1.4 |
| 16 | Ti | 20 | sputtering | 250 | Non | Non | 11 |
| 17 | Ti | 20 | sputtering | room temp. | 250 | Non | 10 |
| 18 | Ti | 30 | sputtering | 350 | Non | Non | 12 |
| 19 | Zr | 25 | sputtering | 250 | Non | Non | 16 |
| 20 | HfSi | 25 | sputtering | room temp. | 400 | Non | 14 |

The first column denotes sample numbers. The second column signifies the materials of the contact layer of electrodes. The third column designates the thicknesses (nm) of the contact layers. The fourth column is the methods of producing ohmic electrodes. The fifth column denotes the temperatures of n-type c-BN substrates at the formation of the contact layers. The sixth column means the temperatures of annealing. "Non" signifies that the sample is not annealed. The seventh column designates whether the contact layer is treated with an acid or not, before the evaporation of Au. "Non" means that the sample is not treated with an acid. If the samples are treated with acid, the names of the acid are listed. The eighth column signifies the change of contact resistances by the heating test. The change of the resistance is defined by a quotient of the post-heating resistance divided by the pre-heating resistance. The effects of the anneal will now be clarified for each sample.

[Samples 1 to 6]

Samples 1 to 6 make the first layer by sputtering a target of a boride or a nitride of Ti, Zr or Hf into particles and depositing the sputtered particles on a cubic boron nitride substrate heated at a temperature more than 300° C. Sample 1 has a TiN first layer of a thickness of 20 nm. Sample 2 makes a TiB$_2$ film of a 15 nm thickness. Sample 3 is provided with a ZrN film of a thickness of 20 nm. Sample 4 produces a ZrB$_2$ film of a 20 nm thickness. Sample 5 has a 15nm HfN layer. Sample 6 covers c-BN with a 20 nm HfB$_2$ film. Samples 1, 3 and 5 are heated at 300° C. Samples 2 and 6 are heated at 350° C. Sample 4 is heated at 400° C. The purpose of heating the substrate above 300° C. is to lower the contact resistance between the first layer and the c-BN substrate. Since the films have been yielded at a high temperature, samples 1 to 6 are annealed no more. No metal remains on the layer, because metal is not employed as a starting material. This fact enables the omission of the acid treatment. Samples 1 to 6 hardly increase the contact resistances of electrodes in spite of the heating of 500° C. in 30 minutes under a pressure of 10$^{-5}$Torr. Sample 1 raises the resistance only by 1.1 times by the heat-treatment. Sample 2 heightens the resistance 1.8 times as large as the pre-heating resistance. Sample 3 has a post-heating resistance 1.5 times as large as the pre-heating resistance. Sample 4 (ZrB$_2$) submits to a slight increase of 1.2 times in a contact resistance. Sample 5 reveals only a 1.3 times increment. Sample 6 (HfB$_2$) shows a smallest increase of 1.1 times. The increases of the contact resistance by the heating test are commonly less than 1.8 times for all samples 1 to 6.

[Samples 7 to 9]

Samples 7 to 9 fabricate a boride or nitride first layer on a c-BN substrate at room temperature by sputtering a boride or nitride of Ti, Zr or Hf, anneal the first layer at a temperature higher than 300° C. and deposit an Au layer on the first boride or nitride layer. The formation at a low temperature requires annealing of above 300° C. to reduce the contact resistance. Sample 7 makes a TiN film at room temperature and anneals it at 400° C. Sample 7 increases the resistance only by 1.2 times by the heat treatment of 500° C. for 30 minutes. Sample 8 produces a ZrB$_2$ film at room temperature and anneals it at 300° C. The heating-test of 500° C. for 30 minutes only heightens the resistance by 1.3 times of sample 8. Sample 9 produces an HfN film at room temperature and anneals it at 350° C. The multiplier of resistance by the heating test is 1.8 for sample 9. The increments of resistance are all less than 1.8 for samples 7 to 9.

[Samples 10 to 12]

Samples 10 to 12 once deposit a single element metal film of Ti, Zr or Hf on a c-BN crystal by sputtering a target of Ti, Zr or Hf and convert the metal film into a boride or a nitride by the reaction with the c-BN substrate. Samples 10 to 12 either sputter the metal film at a temperature more than 300°

C. or anneal the film at a temperature higher than 300° C. Heating above 300° C. at the film formation or at the annealing enables the metal to react with the element atoms of c-BN substrates. Since unreacted metal atoms remained on the first layer, the metal would diffuse to the top of the Au layer. Therefore the residual metal atoms are eliminated from the surface of the first layer by fluoric acid or fluoric nitric acid.

Sample 10 makes a Ti film by sputtering a Ti target on a c-BN substrate at 300° C. and treats the substrate with fluoric acid. Then an Au layer is produced on the first layer. The constant resistance increases 1.5 times by the heat-treatment test of 500° C. for 30 minutes in sample 10. Sample 11 coats a c-BN substrate at room temperature with a Zr film by sputtering a Zr target and subjects the first layer with the c-BN to heat at 350° C. The Zr reacts with boron or nitride atoms of the BN crystal and makes compounds of ZrN and $ZrB_2$. Metal Zr is completely removed by fluoric acid from the surface. Then an Au film is deposited on the layer. Sample 11 submits to a 1.4 times increase of resistance by the heat-test. Sample 12 sputters Hf metal, piles Hf atoms on a c-BN substrate at 350° C. and makes a boride and nitride film of Hf by the reaction induced by the high temperature. The resultant Hf metal is eliminated by fluoric acid. Finally an Au layer is made on the first layer. The heat-test of 500° C. for 30 minutes induces only a 1.2 times increase of the contact resistance in sample 12.

[Samples 13 to 15]

Samples 13 to 15 start from a compound of Ti, Zr or Hf, e.g. TiC, $ZrB_2$ or HfSi. Samples 13 to 15 either make a film of an alloy of Ti, Zr or Hf on a c-BN crystal at a high temperature by sputtering or deposit a film of the alloy on a c-BN crystal at room temperature and subject it to heat above 300° C. The high temperature transforms the alloys into borides or nitrides. Either fluoric acid or fluoric, nitric acid eliminates the resultant metal atoms from the surface of the first layer. Then an Au film is evaporated.

Sample 13 sputters a TiC target into TiC molecules and piles the TiC molecules on a c-BN substrate at 350° C. and makes a film of TiN and $TiB_2$. The extra TiC is removed by fluoric acid. An Au layer is deposited on the TiC layer. The resistance of sample 13 becomes 1.6 times as large as the pre-heating resistance the heat-test of 500° C. for 30 minutes.

Sample 14 forms a $ZrB_2$ layer on a BN substrate at room temperature by sputtering a $ZrB_2$ target, subjects the electrode to heat at 300° C., and treats the first layer with fluoric acid. Finally the first is covered with an Au layer. The resistance increases by 1.8 times due to the heating test. Sample 15 makes an HfSi film on a BN substrate at room temperature by sputtering, anneals it at 400° C. in order to convert the HfSi to an $HfB_2$ and HfN layer. Then sample 15 is treated with fluoric, nitric acid. The heating test raises the resistance by 1.4 times.

[Comparison examples: samples 16 to 18]

Samples 16 to 18 produce metal Ti films on BN substrates and cover the layers with Au layers without acid treatment. What is sputtered is neither boride nor nitride but single element metal Ti. Heating test allows Ti atoms to diffuse into the Au top layer owing to either the reaction temperature less than 300° C. or the lack of the acid treatment.

Sample 16 falls in converting metal Ti into a boride or a nitride, since Ti is deposited on a substrate of a low temperature of 250° C. But the Ti layer is neither annealed above 300° C. nor treated with an acid. Metal Ti remains on the $TiB_2$ and TiN surface. The heat-test of 500° C. for 30 minutes raises the resistance of sample 16 by 11 times. Sample 16 is useless as an ohmic electrode, since the contact resistance is raised by heating. The residual metal Ti incurs the weak heat resistance of sample 16.

Sample 17 deposits Ti on a BN substrate at room temperature and subjects the Ti film to heat at 250° C. Acid treatment is omitted. The low temperature annealing leaves some part of metal Ti unreacted on the surface. Heating facilitates the diffusion of metal Ti into the Au top layer. The diffusing Ti lowers the conductivity of Au by making an alloy of Au and Ti. Thus the heating test raises the resistance to a big extent. The post-heating resistance is ten times as large as the pre-heating resistance.

Sample 18 sputters a Ti target and plies sputtered Ti atoms on a BN substrate at 350° C. The Ti layer experiences neither annealing nor acid treatment. The deposition of 350° C. transforms most of the Ti atoms into $TiB_2$ and TiN. But some part of Ti is left and unreacted as metal atoms. The metal Ti is no more eliminated, since acid treatment is not done. The post-heating resistance is 12 times as big as the pre-heating resistance. The enhancement of resistance results from the diffusion of Ti in the Au layer.

Sample 19 sputters a Zr target and deposits Zr atoms on a BN substrate heated at 250° C. Zr partially changes into $ZrB_2$ and ZrN. However some portion of Zr remains as a single element. The Zr film is neither annealed nor treated with an acid. Omission of the acid treatment allows metal Ti to diffuse into the Au top layer. The heating test enhances the contact resistance by 16 times.

Sample 20 sputters HfSi and piles HfSi molecules on a BN substrate at room temperature. The HfSi layer is annealed at 400° C. Without acid treatment, an Au layer is fabricated on the first layer of Hf. The contact resistance is heightened about 14 times bigger by the heating test of 500° C. for 30 minutes. The annealing of 400° C. converts almost all Hf into HfN and $HfB_2$. But some portion of Hf remains movable atoms. The heating test expedites the diffusion of Hf to the top layer. Alloying Au with Hf decreases the conductivity. Samples 16 to 20 are inappropriate for ohmic contact electrodes of semiconductor devices which will be used in a hot atmosphere, because heating induces a big increase of the resistance of the electrodes.

Table 2. Structure B: Dependence of the change of resistance of electrodes upon metals, thicknesses, production methods, substrate temperatures, annealing temperatures, or acid treatment.

TABLE 2

| | | | | Structure B | | |
|---|---|---|---|---|---|---|
| No. | electrode | thickness (nm) | method | substrate temperature (°C.) | annealing temperature (°C.) | change of registance |
| 21 | Ti/W | 20/200 | sputtering | 300 | Non | 1.2 |
| 22 | Ti/W | 20/200 | sputtering | room temp. | 300 | 1.6 |
| 23 | Ti/Mo | 35/100 | sputtering | 350 | Non | 1.5 |
| 24 | Zr/Ta | 25/250 | sputtering | 300 | Non | 1.8 |
| 25 | Hf/Pt | 20/200 | sputtering | room temp. | 400 | 1.6 |
| 26 | V/Mo | 30/350 | sputtering | room temp. | 300 | 1.1 |
| 27 | Nb/W | 30/150 | sputtering | 400 | Non | 1.2 |
| 28 | Al/W | 25/200 | sputtering | 300 | Non | 1.1 |
| 29 | B/Mo | 20/100 | sputtering | room temp. | 350 | 1.5 |
| 30 | TaSi/Pt | 30/250 | sputtering | 350 | Non | 1.2 |
| 31 | Ti/WC | 20/150 | sputtering | 300 | Non | 1.8 |
| 32 | Zr/MoSi | 25/300 | sputtering | room temp. | 350 | 1.6 |
| 33 | Hf/TaB | 25/250 | sputtering | 400 | Non | 1.4 |
| 34 | Zr/W | 20/100 | sputtering | room temp. (after Zr formation before W formation) | 300 | 1.2 |
| 35 | Ti/W | 20/50 | sputtering | 300 | Non | 5.1 |
| 36 | Ti/Mo | 25/70 | sputtering | 350 | Non | 4.6 |
| 37 | Zr/Mo | 30/80 | sputtering | room temp. | 400 | 4.2 |
| 38 | B | 30 | sputtering | 350 | Non | 15 |

Then structure B is clarified in accordance with embodiments and comparison examples. Table 2 shows the examples of structure B. The first column is sample numbers. The second column denotes materials of the first layer and the second layer of the electrode. The first layer is a low contact resistance layer. The second layer is a diffusion barrier layer. The third column designates the thicknesses of the first and the second layers. The fourth column signifies the methods of producing the layers. The fifth column means the substrate temperatures (°C.) at the formation of the layers. The sixth column denotes whether the sample is annealed or not and the annealing temperature, if annealed. "Non" means that the sample is not annealed. The seventh column is the ratios of the post-heating resistance divided by the pre-heating resistance. The resistances of the electrodes are measured by the four probe method. The heating test is a test examining the change of the samples by heating samples at 500° C. for 30 minutes under a pressure of $10^{-5}$ Torr. The second layer is covered with an Au layer of a 200 nm thickness by evaporation. Samples 21 to 34 are embodiments. Samples 35 to 38 are comparison examples.

[Samples 21 to 25]

The first layer (low contact resistance layer) is any one of Ti, Zr and Hf. The first layer is either deposited at a temperature higher than 300° C. or annealed at a temperature higher than 300° C. The second (diffusion barrier) layer is made from W, Mo Ta or Pt. The third layer is an Au layer of a 200 nm thickness in common.

Sample 21 sputters Ti into particles, piles the Ti particles of a thickness of 20 nm on a c-BN heated at 300° C. Then W is sputtered and deposited into a 200 nm thick film on the Ti layer. Without annealing, Au is finally evaporated on the W layer. The heating test of 500° C. for 30 minutes multiplies the resistance of the three-layered electrode by 1.2. This proves the fact that W is suitable for stopping diffusion of Ti atoms. The small multiplier exhibits an excellent heat-resistance of sample 21.

Sample 22 makes a 20 nm thick Ti layer on a c-BN substrate kept at room temperature by sputtering a Ti target, subjects the first layer to heat at 300° C. and forms a W (barrier) layer of a 200 nm thickness by sputtering. Finally an Au layer of a 200 nm thickness is evaporated on the W layer. The resistance is raised by 1.6 times by the heating test of 30 minutes at 500° C.

Sample 23 heats a c-BN substrate at 350° C., forms a 35 nm thick Ti layer on the BN substrate and makes a 100 nm thick Mo (barrier) layer on the Ti layer. Then the W layer is covered with an Au layer of a 200 nm thickness. The ratio of the post-heating resistance to the pre-heating resistance is only 1.5. The result signifies that W is also useful for a barrier against the diffusion.

Sample 24 makes a 25 nm thick Zr layer on a c-BN substrate heated at 300° C. as a low contact film. Without annealing, a 250 nm thick Ta barrier layer is produced on the Zr layer. Then Au is evaporated into a 200 nm thick film on the Ta layer. The heating test of 500° C. for 30 minutes reveals a 1.8 times increase of the resistance of the electrode. Sample 24 exhibits the usefulness of Zr as the low contact material and the probability of Ta as a barrier.

Sample 25 makes a 20 nm Hf film on a c-BN substrate at room temperature and produces a 200 nm W film on the Hf film at room temperature. Then the films are annealed at 400° C. The resistance rises by 1.6 times by the heating—test. Sample 25 shows that Zr is also suitable for a low contact material and W is pertinent to a barrier.

[Samples 26 and 27]

V and Nb are employed as the material of the first low contact layer. V and Nb have been proposed by ⑦ Japanese Patent Laying Open No. 4-29378. Sample 26 forms a V layer of a 30 nm thickness on a C-BN substrate at room temperature by sputtering and subjects the layer to heat at 300° C. Sputtering makes a 350 nm thick Mo layer as a barrier layer. Then an Au top layer of a 200 nm thickness is produced on the Mo layer. The heating test of 500° C. for 30 minutes invites only a 1.1 times increase of the resistance. Sample 26 signifies that V is useful for a low contact metal and that Mo is effective as a barrier.

Sample 27 heats a c-BN substrate to 400° C., sputters Nb into particles, deposits Nb particles on the c-BN crystal and further makes a W layer by sputtering. Without annealing, an Au layer is produced on the W barrier film. The heating test of 500° C. for 30 minutes invites only a 1.1 rise of the resistance. Sample 27 exhibits the excellency of Nb as a low contact material and of W as a barrier.

[Samples 28 to 29]

The first low contact layer is made from Al or B, which has suggested by ⑥Japanese Patent Laying Open No. 4-29377. Sample 28 makes an Al contact layer of a 25 nm thickness on a c-BN heated at 300° C. by sputtering. An Mo layer is deposited till a 100 nm thickness on the Al layer by sputtering. A 200 nm Au layer at 300° C. is formed on the Mo layer. The heating test brings about a slight increase of resistance of 1.6 times.

Sample 29 makes a 20 nm B film and a 100 nm Mo film on a c-BN substrate at room temperature, and anneals the films at 350° C. Then an Au layer is deposited on the films. 1.5 is the multiplier of the change of resistance before and after the heating test of 500° C. for 30 minutes. Sample 29 exhibits the effective use of B as a low contact material and the excellency of Mo as a barrier.

[Sample 30]

An alloy of Ta is adopted as a material of the first layer. The use of a Ta alloy has been suggested by ⑦ Japanese Patent Laying Open No. 4-29378.

Sample 30 forms a 30 nm thick TaSi layer on a c-BN substrate heated at 350° C. by sputtering, covers the TaSi by a Pt layer of a 250 nm thickness and deposits an Au layer of a 200 nm thickness. The resistance rises by 1.2 times by the heating test of 500° C. for 30 minutes. This proves the suitability of Ta as a low contact material and of Mo as a barrier.

[Samples 31 to 33]

The first (low contact resistance) layers are made from any one of single element metals Ti, Zr and Hf, which have been proposed by ④ Japanese Patent Laying Open No. 4-29375. The second layer is built with an alloy of any one of W, Mo, Ta and Pt. Sample 31 makes a 20 nm thick Ti layer on a c-BN substrate heated to 300° C. by sputtering, forms a WC barrier layer of 150 nm on the Ti layer by sputtering, and finally covers the WC layer with an Au layer of 200 nm. The heat test of 500° C. for 30 minutes multiplies a resistance by 1.8 times. Sample 31 clarifies the adequacy of the low contact layer of Ti and the barrier of WC.

Sample 32 yields a Zr layer of 25 nm by sputtering on a c-BN substrate at room temperature, anneals the Zr film at 350° C., makes an MoSi film on the Zr layer by sputtering, and covers the MoSi film with an Au film of a 200 nm thickness. The annealing forms an ohmic contact of Zr with the n-type BN. The post-heating resistance is 1.6 times as big as the pre-heating one. This proves the suitability of MoSi as a candidate for a barrier.

Sample 33 makes an Hf layer of 25 nm by sputtering on a c-BN substrate at 400° C. Without annealing, another sputtering makes a TaB barrier layer on the Hf layer. An Au layer is deposited on the TaB layer. The change of the resistance is 1.4 times by the heating test. This example clarifies the capability of boride of tantalum (TAB) for a barrier material.

[Sample 34]

The first layer is a single element metal of Zr. The second layer is made from W. Sputtering makes a 20 nm thick Zr layer on a cool BN substrate, and subjects the Zr layer to heat at 300° C., and another sputtering process forms a 100 nm W layer on the Zr layer. Finally Au is deposited on the V/layer. The heat test multiplies the resistance only by 1.2 times.

[Samples 35 to 38: comparison examples]

Samples 35 to 38 have a too thin diffusion barrier layer to prohibit the low contact resistant material from diffusing upward to the Au layer.

Sample 35 makes a 20 nm thick Ti layer by sputtering on a c-BN substrate at 300° C. and produces a 50 nm thick W layer on the Ti layer. The heating test of 500° C. for 30 minutes raises the resistance by 5.1 times. This result signifies that too thin barrier layer is insufficient to impede Ti atoms from diffusing. The barrier requires a sufficient thickness.

In sample 36, sputtering makes a 25 nm Ti layer on a c-BN substrate at 350° C. Another sputtering makes a 70 nm thick Mo barrier on the Ti layer. The contact resistance is multiplied by 4.6 by the heating test of 500° C. for 30 minutes in sample 36. The 70 nm thick Mo layer is impotent to hinder the diffusion of Ti atoms entirely.

Sample 37 makes a Zr layer of a 30 nm thickness on a cool c-BN substrate, anneals the Zr layer at 400° C., and produces an Mo layer of a 80 nm thickness on the Zr layer by sputtering. An Au layer is produced on the Mo layer. The resistance is raised by 4.2 times by the heating test of 500° C. for 30 minutes. The Mo barrier of 80 nm is too thin to forbid Zr diffusing to the Au layer.

Sample 38 heats a c-BN substrate at 350° C., sputters a B target, and forms a 30 nm thick B layer on the heated BN substrate. Without building a barrier layer, an Au layer is deposited on the B layer. The resistance of the electrode is multiplied by 15 times by the heating test of 500° C. for 30 minutes. The big increase of resistance is caused by the diffusion of B atoms into the Au layer. The diffused B atoms make an alloy with Au having a high resistivity. Sample 38 proves the importance of the barrier layer in the ohmic electrodes.

All samples 1 to 38 have been explained till now. The electrodes of this invention are commonly favored with a low resistance similar to the resistance of a bulk Au metal. The electrodes maintain the golden color in spite of the heating test of 500° C. for 30 minutes. This means that the low contact resistive materials do not diffuse into the Au top layer by the heating test. The Au layer is left unpolluted with the metals of Ti, Zr, Hf or other materials of the first layer. No diffusion into the Au layer is proved by the fact that the resistance is hardly increased by the heating test in the embodiments of samples 1 to 15 and samples 21 to 34. The multipliers are all less than 1.8 in the embodiments.

On the contrary, comparison examples (16 to 20 and 35 to 38) have all experienced a big increase of the resistance by the heating test. All samples lose the golden color from the surface of the top layer due to alloying of Au with other metals. The contact resistances are raised by more than 5 times by the heating test of 500° C. for 30 minutes. Samples 35 to 37 with a barrier layer, even if imperfect, still suppress the increase less than ten times. However sample 38 which lacks the barrier suffers from the big resistance increase of more than 10 times.

Then the components of the surfaces of the electrodes have been analyzed for comparison examples 16 to 20 and 35 to 38. The component analysis clarifies that the top layers have lost almost all Au and are occupied by the material of lower layers. This fact signifies that the materials of lower layers have diffused directly or indirectly through the intermediate layers into the Au top layers.

Figure 2:
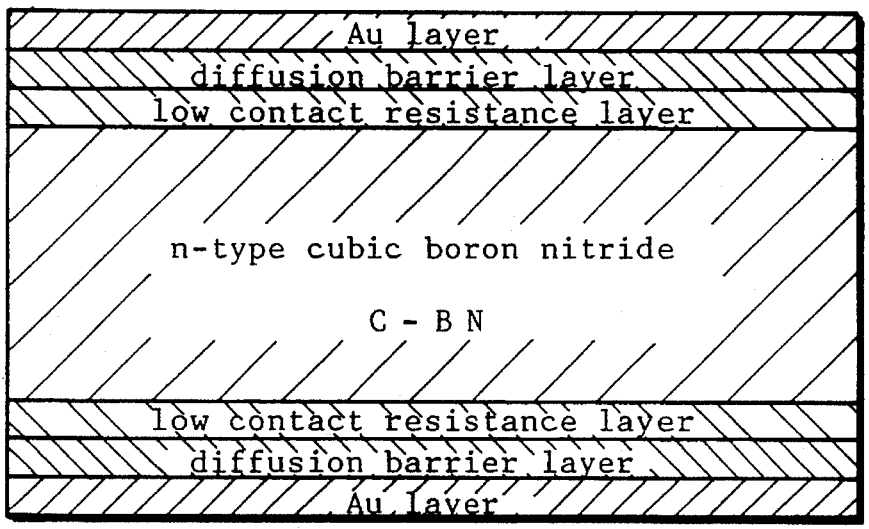
FIG. 2 is a sectional view of a c-BN substrate with a pair of electrodes of structure B on both surfaces to measure the resistance of the electrodes.

Furthermore, samples 1 to 15 and samples 20 to 34, embodiment of this invention are estimated by the absolute resistance. In order to measure the absolute value of the resistances, a pair of two-layered electrodes are fabricated on both surfaces of samples 1 to 15 as shown in FIG. 1. Similarly a pair of three-layered electrodes are produced on both surfaces of samples 21 to 34 as shown in FIG. 2. In the sandwich structure, the current is measured for the applied voltage on both electrodes. The total resistance is deduced from the voltage and the current. The contact resistance of the electrodes is calculated by subtracting the inherent resistance of the BN substrate. All the embodiments have very low contact resistances less than $6 \times 10^{-1}$ Ω cm. This is one of a preferable region of the contact resistance of an ohmic electrode. The sandwich structure of electrodes of FIG. 1 or FIG. 2 is again heated at 500° C. for 30 minutes under a pressure less than $10^{-5}$ Torr. The resistances do not increase by the heating test. The resistance is stable despite the heating test. This fact proves an excellent heat-resistance of the electrodes of this invention. This invention is suitable for the electrodes of the devices which will be used in a high temperature atmosphere.

What we claim is:

1. A method of producing a ohmic electrode on n-type semiconductor cubic boron nitride comprising the steps of:

forming a low contact resistance layer of a boride or a nitride of an alloy of Ti, Zr or Hf on an n-type cubic nitride substrate at a temperature higher than 300° C., and making an Au layer on the low contact resistance layer.

2. A method of producing an ohmic electrode on n-type semiconductor cubic boron nitride comprising the steps of:

forming a low contact resistance layer of a boride or a nitride of Ti, Zr or Hf on an n-type cubic nitride substrate at a temperature higher than 300° C., and making an Au layer on the low contact resistance layer.

3. A method of producing an ohmic electrode on n-type semiconductor cubic boron nitride comprising the steps of:

forming a low contact resistance layer of a boride or a nitride of an alloy of Ti, Zr or Hf on an n-type cubic boron nitride substrate by annealing the boron nitride substrate with the low contact resistance layer at a temperature higher than 300° C., and making an Au layer on the low contact resistance layer.

4. A method of producing an ohmic electrode on n-type semiconductor cubic boron nitride comprising the steps of:

forming a low contact resistance layer of a boride or a nitride of an alloy of Ti, Zr or Hf on an n-type cubic boron nitride substrate by annealing the boron nitride substrate with the low contact resistance layer at a temperature higher than 300° C., and making an Au layer on the low contact resistance layer.

5. A method of producing an ohmic electrode on n-type semiconductor cubic boron nitride comprising the steps of:

forming a low contact resistance layer of metal of Ti, Zr or Hf, or an alloy of Ti, Zr or Hf on an n-type cubic boron nitride substrate at a temperature higher than 300° C. in order to let the metal or alloy react with the boron or nitrogen atoms in the substrate, and making an Au layer on the low contact resistance layer.

6. A method of producing an ohmic electrode on n-type semiconductor cubic boron nitride comprising the steps of:

forming a low contact resistance layer of a metal of Ti, Zr or Hf, or an alloy of Ti, Zr or Hf on an n-type cubic boron nitride substrate annealing the substrate with the low contact resistance layer at a temperature higher than 300° C. in order to let the metal or alloy react with the boron or nitrogen atoms in the substrate, and making an Au layer on the low contact resistance layer.

7. A method as claimed in claim 6, wherein unreacted metal or alloy is removed by an acid treatment from a surface of the low contact resistance layer before making the Au layer.

8. A method of producing an ohmic electrode on n-type semiconductor cubic boron nitride comprising the steps of:

forming a low contact resistance layer on an n-type cubic boron nitride substrate at a temperature higher than 300° C., the low contact resistance layer being formed from a material selected from the group consisting of: (1) a metal of Ti, Zr, Hf, B, Al, Ga, Un, V, Nb or Ta, (2) an alloy of Si and Ti, Zr, Hf, B, Al, Ga, In, V, Nb or Ta, or (3) an alloy of S and Ti, Zr, Hf, B, Al, Ga, In, V, Nb or Ta, depositing a diffusion barrier layer of a metal or an alloy of W, Mo, Ta or Pt, and making an Au layer.

9. A method of producing an ohmic electrode on n-type semiconductor cubic boron nitride comprising the steps of:

forming a low contact resistance layer on an n-type cubic boron nitride substrate, the low contact resistance layer being formed from a material selected from the group consisting of: (1) a metal of Ti, Zr, Hf, B, Al, Ga, In, V, Nb or Ta, (2) an alloy of Si and Ti, Zr, Hf, B, Al, Ga, In, V, Nb or Ta, or (3) an alloy of S and Ti, Zr, Hf, B, Al, Ga, In, V, Nb or Ta, annealing the substrate with the low contact resistance layer at a temperature higher than 300° C., depositing a diffusion barrier layer of a metal or an alloy of W, Mo, Ta or Pt, and making an Au layer.

* * * * *